(12) United States Patent
Yoo et al.

(10) Patent No.: US 7,943,000 B2
(45) Date of Patent: May 17, 2011

(54) ATTACHING DEVICE AND METHOD OF FABRICATING ORGANIC LIGHT EMMITING DEVICE USING THE SAME

(75) Inventors: Choong Keun Yoo, Anyang-si (KR); Ae Kyung Jeon, Seoul (KR); Choong Keun Yoo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 840 days.

(21) Appl. No.: 11/819,931

(22) Filed: Jun. 29, 2007

(65) Prior Publication Data

US 2008/0006878 A1  Jan. 10, 2008

(30) Foreign Application Priority Data

Jun. 30, 2006 (KR) .................. 10-2006-0061153

(51) Int. Cl.
*B29C 65/00* (2006.01)
(52) U.S. Cl. ............. 156/286; 349/187; 445/24; 445/25
(58) Field of Classification Search .................. 156/285, 156/381, 538, 539, 556; 349/187; 445/24, 445/25

See application file for complete search history.

(56) References Cited

U.S. PATENT DOCUMENTS

| | | | |
|---|---|---|---|
| 2002/0126437 A1* | 9/2002 | Chen | 361/234 |
| 2003/0145943 A1* | 8/2003 | Lee et al. | 156/285 |
| 2003/0168176 A1* | 9/2003 | Byun et al. | 156/382 |
| 2003/0178134 A1* | 9/2003 | Muramoto et al. | 156/285 |
| 2004/0195959 A1* | 10/2004 | Park et al. | 313/500 |
| 2006/0027318 A1* | 2/2006 | Hashizume et al. | 156/285 |

* cited by examiner

*Primary Examiner* — Christopher Schatz
(74) *Attorney, Agent, or Firm* — McKenna Long & Aldridge LLP

(57) ABSTRACT

An attaching device and a method of fabricating an organic light emitting device using the same are disclosed. The attaching device includes a process chamber, first and second substrate supporters, a substrate detachable part, and an open-close valve. The first and second substrate supporters are positioned inside the process chamber, load and fix substrates. The substrate detachable part is positioned inside the second substrate supporter, and moves up and down to allow the second substrate supporter to instantaneously receive a physical pressure. The open-close valve is positioned on a portion of the process chamber, and opens and closes the process chamber to control a pressure inside the process chamber.

16 Claims, 4 Drawing Sheets

ATTACHING DEVICE AND METHOD OF FABRICATING ORGANIC LIGHT EMMITING DEVICE USING THE SAME

This application claims the benefit of Korean Patent Application No. 10-2006-0061153 filed in Korea on Jun. 30, 2006, which is incorporated herein by reference for all purposes as if fully set forth herein.

BACKGROUND OF THE INVENTION

1. Field of the Invention

An exemplary embodiment of the present invention relates to an attaching device and a method of fabricating an organic light emitting device using the same.

2. Discussion of the Related Art

Out of flat panel display devices, light emitting devices are a self-emissive type device that emits light by electrically exciting a compound. Since the light emitting devices do not need a backlight unit which is used in a liquid crystal display (LCD), the light emitting devices can be fabricated to be thin and light through a simple fabrication process. Furthermore, the light emitting devices can be fabricated at low temperature environment, and have characteristics of fast response time, low power consumption, excellent viewing angle, and high contrast.

In particular, an organic light emitting device comprises an organic light-emitting layer between an anode electrode and a cathode electrode. The organic light emitting device forms an exciton, which is a hole-electron pair, by combining holes received from the anode electrode and electrons received from the cathode electrode inside the organic light-emitting layer, and emits light by energy generated when the exciton returns to a ground level.

In general, the organic light emitting device is fabricated by forming thin film transistors on a substrate, forming organic light emitting diodes on the thin film transistors to be electrically connected to the thin film transistors, and attaching the substrate to an encapsulation substrate. When the light emitting diode is bad although the thin film transistors are good, the organic light emitting device is determined as a defective good. In other words, process time and fabrication cost of the organic light emitting device may be wasted because the yield of the organic light emitting device is determined by the yield of an organic light emitting diode.

In order to overcome such a problem, an organic light emitting device was fabricated through the following processes. That is, a thin film transistor (TFT) array substrate provided with thin film transistors and an organic light emitting diode (OLED) array substrate provided with organic light emitting diodes were fabricated separately. A physical pressure was then applied to the TFT and OLED array substrates inside a process chamber to attach the TFT array substrate to the OLED array substrate.

However, it is difficult to uniformly maintain flatness between substrate supporters supporting the two substrates inside the process chamber when attaching the two substrates. It is also difficult to closely attach the entire surfaces of the substrates to the substrate supporters. Such difficulties reduce the process yield and increase fabrication cost of the organic light emitting device.

With a recent trend toward large-sized organic light emitting devices, the organic light emitting devices may be damaged because a pressure is applied to a portion of two substrates when attaching the two substrates. Therefore, life span and reliability of the organic light emitting devices are reduced.

SUMMARY OF THE INVENTION

Accordingly, an exemplary embodiment provides an organic light emitting device capable of increasing the fabrication yield and life span.

In one aspect, an attaching device comprises a process chamber, first and second substrate supporters that are positioned inside the process chamber, load and fix substrates, a substrate detachable part that is positioned inside the second substrate supporter, and moves up and down to allow the second substrate supporter to instantaneously receive a physical pressure, and an open-close valve that is positioned on a portion of the process chamber, and opens and closes the process chamber to control a pressure inside the process chamber.

In another aspect, a method of fabricating an organic light emitting device comprises preparing a first substrate and a second substrate, coating a sealant on a portion of the first substrate or the second substrate, loading the first substrate and the second substrate inside a process chamber to load the first substrate and the second substrate on a first substrate supporter and a second substrate supporter, respectively, the process chamber including the first substrate supporter and the second substrate supporter for supporting the first substrate and the second substrate, a substrate detachable part positioned inside the second substrate supporter, and an open-close valve, moving the second substrate supporter on which the second substrate is positioned to align the first substrate and the second substrate, detaching the second substrate from the second substrate supporter using the substrate detachable part to attach the first and second substrates to each other, injecting an air into the process chamber through the open-close valve to apply an atmospheric pressure outside the attached first and second substrates, and hardening the sealant to seal the first and second substrates.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
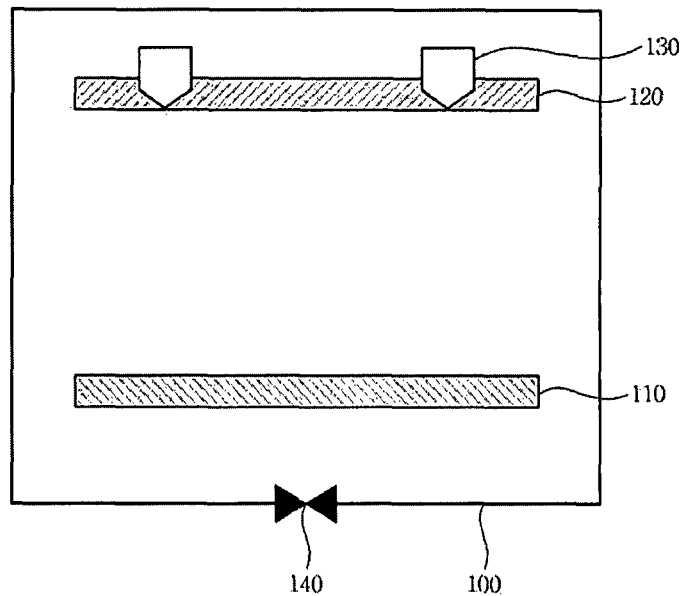
FIG. 1 is a schematic diagram of an attaching device according to an exemplary embodiment of the present invention.

FIG. 1 is a schematic diagram of an attaching device according to an exemplary embodiment of the present invention.

Referring to FIG. 1, the attaching device according to an exemplary embodiment of the present invention comprises a process chamber 100, first and second substrate supporters 110 and 120 for loading, fixing, and supporting substrates, and an open-close valve 140 for controlling a pressure inside the process chamber 100.

The first and second substrate supporters 110 and 120 safely load and fix the substrates inside the process chamber 100, and fix the substrates at a corresponding working location inside the process chamber 100. At least one of the first or second substrate supporters 110 and 120 may comprise an electrostatic chuck (ESC: not shown) that applies an electrostatic force to the inside of at least one of the first or second substrate supporters 110 and 120 to fix the substrates. The electrostatic chuck may comprise electrodes, that have different polarities by receiving direct current (DC) voltages of different polarities and are made in pair, to attach the substrate to each other using the electrostatic force.

The second substrate supporter 120 may comprise a substrate detachable part 130. The substrate detachable part 130 moves up and down to instantaneously apply a physical pressure to the substrate loaded and fixed on the second substrate supporter 120, and pushes the substrate from the second substrate supporter 120, thereby allowing the substrate fixed to the second substrate supporter 120 to be detached from the second substrate supporter 120. The substrate detachable part 130 may be a pusher, a press, or an air cylinder. The substrate detachable part 130 may be another part in addition to the pusher, the press, or the air cylinder as long as there is the application of a physical pressure to the substrate. The substrate detachable part 130 may be formed of non-conductive material such as rubber, resin, and ceramic not to generate arc when attaching the substrate detachable part 130 to the substrate.

The second substrate supporter 120 may comprise a ground part (not shown) for removing electrostatic force from the second substrate supporter 120 so as to more easily detach the substrate from the second substrate supporter 120 using the substrate detachable part 130.

At least one of the first and second substrate supporters 110 and 120 may comprise a moving part (not shown) that moves up and down to align the substrates positioned on the first and second substrate supporters 110 and 120. The moving part (not shown) may comprise a moving shaft and a driving motor, and the first and second substrate supporters 110 and 120 may selectively move using the moving part.

The open-close valve 140 may be positioned on a lower portion of the process chamber 100. The open-close valve 140 may be connected to a pressure controller (not shown) comprising a pressure pump (not shown) to control a pressure inside the process chamber 100.

FIGS. 2 to 7 are schematic diagrams sequentially illustrating each of stages in a method of fabricating an organic light emitting device using the attaching device of FIG. 1.

Figure 2:
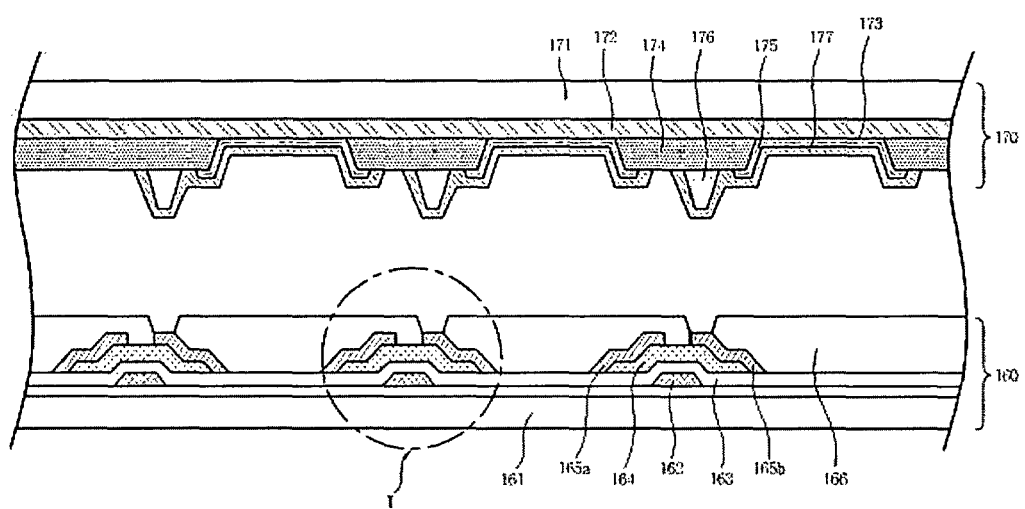
FIG. 2 through and including 7 are schematic diagrams sequentially illustrating each of stages in a method of fabricating an organic light emitting device using an attaching device according to an exemplary embodiment of the present invention.

Referring to FIG. 2, a first substrate 160 and a second substrate 170 are prepared. The first substrate 160 may be a thin film transistor (TFT) array substrate provided with thin film transistors T, and the second substrate 170 may be an organic light emitting diode (OLED) array substrate provided with organic light emitting diodes.

In the first substrate 160, a gate electrode 162 is positioned on a first base substrate 161, and a first gate insulating layer 163 is positioned on the first base substrate 161 including the gate electrode 162. A semiconductor layer 164 is positioned on the first gate insulating layer 163 so that a portion of the semiconductor layer 164 corresponds to the gate electrode 162. A source electrode 165a and a drain electrode 165b are positioned on a portion of the semiconductor layer 164. A second insulating layer 166 is positioned on the source electrode 165a and the drain electrode 165b to expose a portion of the drain electrode 165b. Although the explanation was given of an example of the thin film transistor T having a bottom gate structure in an exemplary embodiment of the present invention, an exemplary embodiment of the present invention is not limited thereto. The thin film transistor T may have a top gate structure.

In the second substrate 170, a first electrode 172 is positioned on a second base substrate 171. The first electrode 172 may be an anode electrode, and a transparent electrode made of a transparent material such as indium tin oxide (ITO). An opening 173 is positioned on the first electrode 172 to expose a portion of the first electrode 172. A third gate insulating layer 174 comprises opening 173 and defines each pixel. An organic light-emitting layer 175 is positioned inside the opening 173 of the third gate insulating layer 174, and a contact spacer 176 is positioned on the third gate insulating layer 174. A second electrode 177 that is patterned in different pattern forms in each pixel is positioned on the second base substrate 171 comprising the organic light-emitting layer 175 and the contact spacer 176. The second electrode 177 may be a cathode electrode and formed of a metal having a high work function such as aluminum and magnesium. The second electrode 177 positioned on the contact spacer 176 is electrically connected to the drain electrode 165b when attaching the first substrate 160 to the second substrate 170.

A sealant 180 (refer to FIG. 3) may be coated on a portion of the first substrate 160 to attach the first substrate 160 to the second substrate 170 and to seal the inside of the attached first and second substrates.

Figure 3:
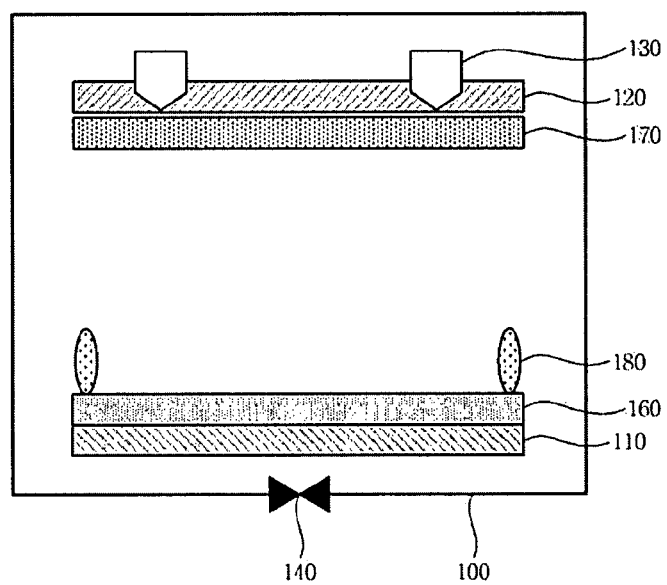

Referring to FIG. 3, the first and second substrates 160 and 170 thus fabricated are loaded inside the process chamber 100. The process chamber 100 is in a vacuum state of $10^{-3}$ to $10^{-8}$ Torr, and the open-close valve 140 remains in closed state. A substrate loading device (not shown) including at least one robot arm may be used to move the first and second substrates 160 and 170 inside the process chamber 100.

The first and second substrates 160 and 170 are safely loaded on the first and second substrate supporters 110 and 120 inside the process chamber 100, respectively. The first and second substrate supporters 110 and 120 each may comprise one or more electrostatic chucks (not shown) that apply an electrostatic force to the inside of the first and second substrate supporters 110 and 120 to fix the first and second substrates 160 and 170. The second substrate supporter 120 may comprise a ground part (not shown) for removing electrostatic force from the second substrate 170.

Figure 4:
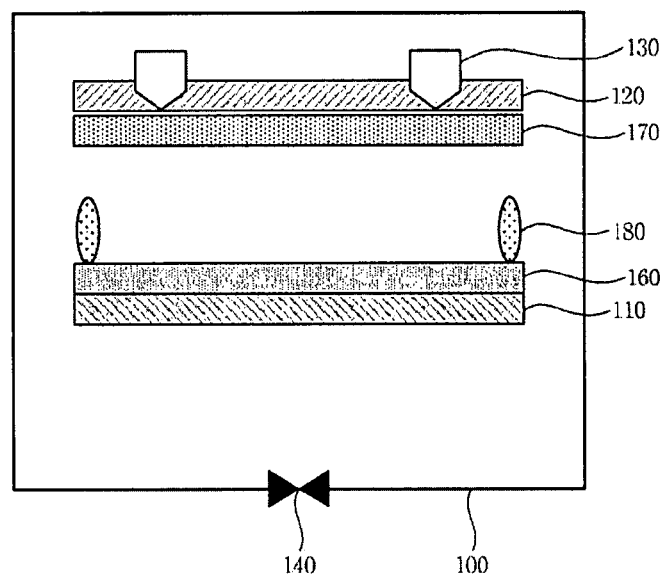

Referring to FIG. 4, the first substrate supporter 110 on which the first substrate 160 is loaded is closely lifted to the second substrate supporter 120 to align the first and second substrates 160 and 170. To more accurately align the first and second substrates 160 and 170, the first and second substrates 160 and 170 may be close to each other to have a distance therebetween less than several hundred micrometer.

Figure 5:
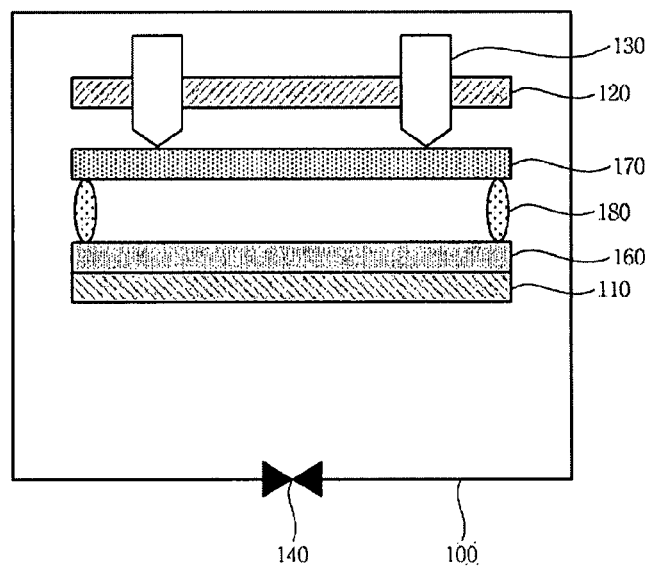

Referring to FIG. 5, the substrate detachable part 130 inside the second substrate supporter 120 instantaneously applies a physical pressure to the second substrate 170. Hence, the second substrate 170 is detached from the second substrate supporter 120, and free-falls to be positioned on the first substrate 160. Accordingly, the first and second substrates 160 and 170 are attached to each other.

The substrate detachable part 130 may be a pusher, a press, or an air cylinder capable of applying a physical pressure to the second substrate 170. The substrate detachable part 130 may be formed of non-conductive material such as rubber, resin, and ceramic not to generate arc when attaching the substrate detachable part 130 to the second substrate 170.

To more easily detach the second substrate 170 from the second substrate supporter 120, the application of a physical pressure to the second substrate 170 using the substrate detachable part 130 and the removal of electrostatic force from the second substrate 170 using the ground part (not shown) of the second substrate supporter 120 are simultaneously performed. Otherwise, after the application of a physical pressure to the second substrate 170 using the substrate detachable part 130, electrostatic force is removed from the second substrate 170 using the ground part (not shown) of the second substrate supporter 120. Hence, since a force for fixing the second substrate 170 is removed, the second substrate 170 can be detached more easily.

Since the inside of the process chamber 100 remains in a vacuum state when attaching the first and second substrates 160 and 170 to each other, the inside of the attached first and second substrates 160 and 170 remains in a vacuum state. Therefore, the deterioration of organic light emitting diode by oxygen and humidity can be minimized, and the organic light emitting diode is prevented from being damaged by preventing impurity from being penetrated during the attaching process.

Figure 6:
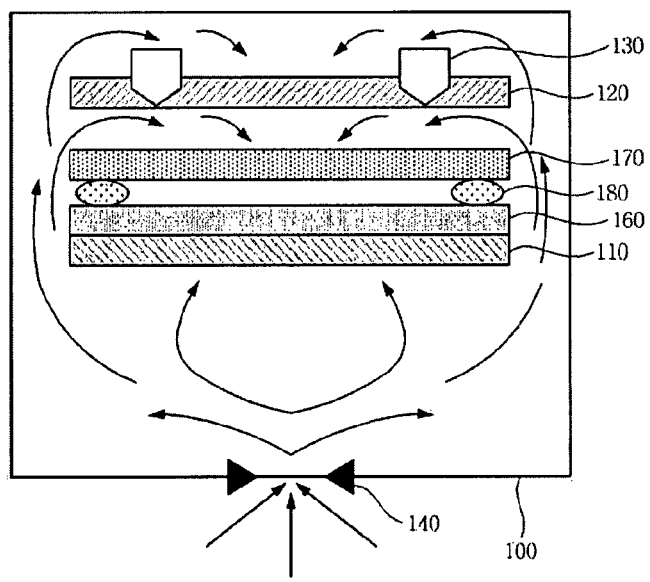

Referring to FIG. 6, the open-close valve 140 opens to inject an air into the process chamber 100 for several seconds to several minutes. An inert gas such as nitrogen ($N_2$) or argon (Ar) may be used. As a result, the inside of the process chamber 100 becomes in an atmospheric pressure state.

At this time, the inside of the attached first and second substrates 160 and 170 remains in a vacuum state, and the process chamber 100 (i.e., the outside of the attached first and second substrates 160 and 170) remains in an atmospheric pressure state. Such a pressure difference makes the first and second substrates 160 and 170 to be more closely attached to each other in the vacuum state of the inside of the attached first and second substrates 160 and 170.

Figure 7:
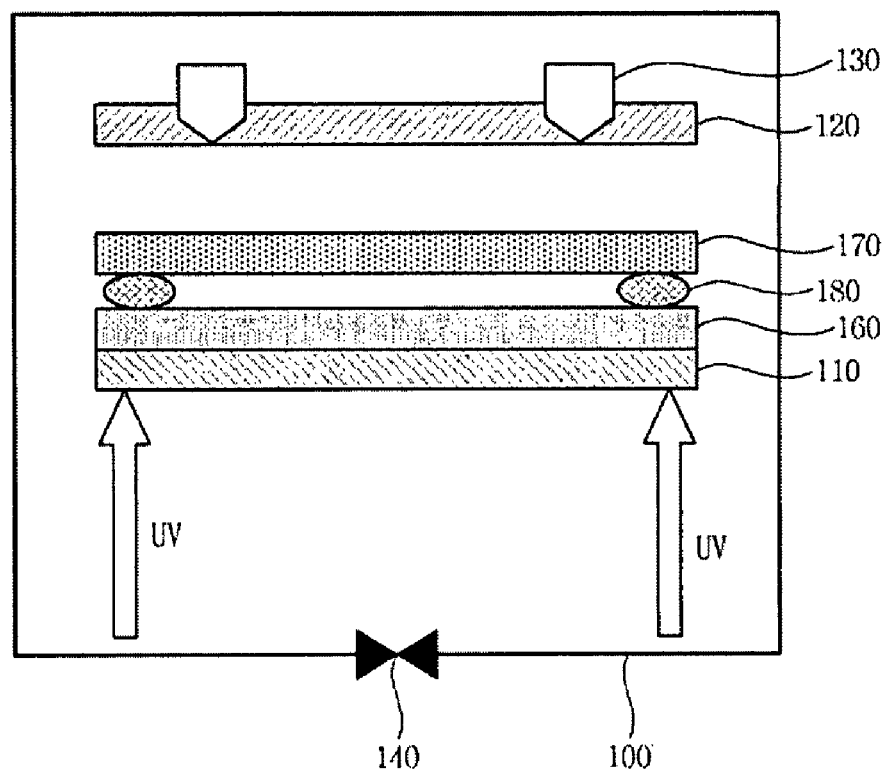

Referring to FIG. 7, ultraviolet (UV) rays are radiated to a portion of the attached first and second substrates 160 and 170 to harden the sealant 180. The inside of the attached first and second substrates 160 and 170 is sealed by the sealant 180 to complete the organic light emitting device.

As described above, since the attaching device according to an exemplary embodiment of the present invention comprises the substrate detachable part 130 capable of applying the physical pressure to the second substrate supporter 120, the first and second substrates 160 and 170 are attached using the substrate detachable part 130. As a result, the inside of the attached first and second substrates 160 and 170 remains in a vacuum state. Accordingly, the fabrication yield and the life span of the organic light emitting device can be improved by preventing organic light emitting diode from being deteriorated or polluted by impurity.

An exemplary embodiment of the present invention provides an organic light emitting device capable of increasing the fabrication yield, life span, and reliability thereof.

It will be apparent to those skilled in the art that various modifications and variations can be made in the liquid crystal display device and array substrate for the same of the present invention without departing from the spirit or scope of the invention. Thus, it is intended that the present invention covers the modifications and variations of this invention provided they come within the scope of the appended claims and their equivalents.

What is claimed is:

1. A method of fabricating an organic light emitting device comprising:

preparing a first substrate and a second substrate;

coating a sealant on a portion of the first substrate or the second substrate;

loading the first substrate and the second substrate inside a process chamber to load the first substrate and the second substrate on a first substrate supporter and a second substrate supporter, respectively, the process chamber including the first substrate supporter and the second substrate supporter for supporting the first substrate and the second substrate, a substrate detachable part positioned inside the second substrate supporter, and an open-close valve;

vacuuming the process chamber;

moving the second substrate supporter on which the second substrate is positioned to align the first substrate and the second substrate;

detaching the second substrate from the second substrate supporter by applying a physical force from the substrate detachable part to the second substrate to fall down the second substrate onto the first substrate so that the first and second substrates are attached to each other;

injecting air into the process chamber through the open-close valve to apply an atmospheric pressure outside of the attached first and second substrates evenly over the whole surface; and hardening the sealant to seal the first and second substrates.

2. The method of claim 1, wherein in the detaching the second substrate from the second substrate supporter, the sealant is sealing an inside of the attached first and second substrates from an outside thereof.

3. The method of claim 1, wherein the substrate detachable part is one of a pusher, a press, and an air cylinder.

4. The method of claim 1 or 3, wherein the substrate detachable part is formed of a non-conductive material.

5. The method of claim 1, wherein at least one of the first substrate supporter or the second substrate supporter comprises an electrostatic chuck (ESC) that applies an electrostatic force to the inside of at least one of the first substrate supporter or the second substrate supporter to fix the first and second substrates.

6. The method of claim 5, wherein the second substrate supporter comprises a ground part for removing an electrostatic force.

7. The method of claim 6, wherein attaching the first and second substrates comprises simultaneously performing the application of a physical pressure to the second substrate using the substrate detachable part and the removal of an electrostatic force from the second substrate using the ground part, or after the application of the physical pressure to the second substrate using the substrate detachable part, removing the electrostatic force from the second substrate using the ground part.

8. The method of claim 1, wherein before applying the atmospheric pressure to the outside of the attached first and second substrates, the process chamber remains in a vacuum state of about 10-3 to about 10-8 Torr.

9. The method of claim 1, wherein sealing the first and second substrates comprises radiating ultraviolet (UV) rays to the sealant.

10. The method of claim 1, wherein the first substrate is a thin film transistor (TFT) array substrate provided with a thin film transistor.

11. The method of claim 10, wherein the thin film transistor comprises a semiconductor layer, a gate electrode corresponding to a portion of the semiconductor layer, a gate insulating layer interposed between the semiconductor layer and the gate electrode, and a source electrode and a drain electrode electrically connected to a portion of the semiconductor layer.

12. The method of claim 11, wherein the second substrate is an organic light emitting diode (OLED) array substrate provided with an organic light emitting diode.

13. The method of claim 12, wherein the organic light emitting diode comprises a lower electrode, an organic light-emitting layer, and an upper electrode.

14. The method of claim 13, wherein the organic light-emitting layer is formed of an organic material.

15. The method of claim 13, wherein the upper electrode is an anode electrode formed of a transparent conductive layer.

16. The method of claim 13, wherein the drain electrode and the lower electrode are electrically connected to each other when attaching the first and second substrates.

* * * * *